United States Patent [19]
Luff et al.

[11] Patent Number: 5,197,085
[45] Date of Patent: Mar. 23, 1993

[54] RADIO RECEIVER

[75] Inventors: Gwilym F. Luff; John F. Wilson; Richard J. Youell, all of Cambridge, England

[73] Assignee: U.S. Philips Corporation, New York, N.Y.

[21] Appl. No.: 545,303

[22] Filed: Jun. 27, 1990

[30] Foreign Application Priority Data

Jun. 30, 1989 [GB] United Kingdom ............... 8915063

[51] Int. Cl.$^5$ .......................................... H04L 27/14
[52] U.S. Cl. ........................... 375/88; 375/42; 375/79; 329/302; 329/303; 329/327
[58] Field of Search ............... 375/88, 91, 79, 80, 375/83, 84, 85, 86, 42, 77, 39; 329/300, 302, 303, 327, 323, 306

[56] References Cited

U.S. PATENT DOCUMENTS

| | | | |
|---|---|---|---|
| 4,322,851 | 3/1982 | Vance ................................ | 375/88 |
| 4,462,107 | 7/1984 | Vance ................................ | 375/88 |
| 4,475,219 | 10/1984 | Puckette ........................ | 375/88 X |
| 4,521,892 | 6/1985 | Vance et al. ................... | 375/88 |
| 4,571,738 | 2/1986 | Vance ................................ | 375/82 |
| 4,716,579 | 12/1987 | Masterton ..................... | 375/81 |
| 4,745,627 | 5/1988 | Gubser .......................... | 375/88 |
| 4,752,742 | 6/1988 | Akaiwa ....................... | 375/88 X |

*Primary Examiner*—Curtis Kuntz
*Assistant Examiner*—Young Tse
*Attorney, Agent, or Firm*—David R. Treacy

[57] ABSTRACT

A receiver for FSK signals produces quadrature related first and second frequency down-converted difference signals (I and Q), which are amplitude limited to form respectively first and second square wave signals. The first and second square wave signals are sampled at changes in polarity of the second and first square wave signals, combined and fed to a memory, for example a hysteresis circuit, responsive to a change in polarity in the combined signal for producing a first substantially constant dc output until the next following change in polarity is detected whereupon a second substantially constant dc output is produced. By using a memory rather than a filter, reactive components are avoided making it less expensive to integrate. Also, a fixed level bit slicer can be used.

9 Claims, 6 Drawing Sheets

Fig.5A. I
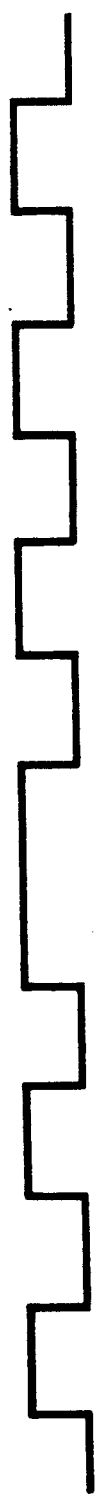
Fig.5B. Q
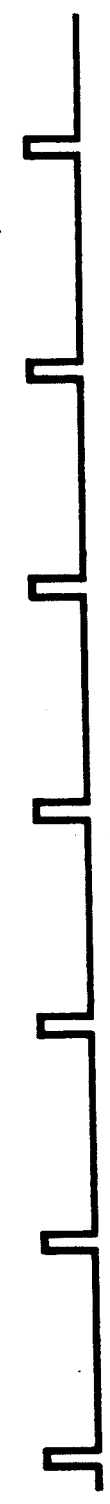
Fig.5C. I'
Fig.5D. Ī'
Fig.5E. Q'
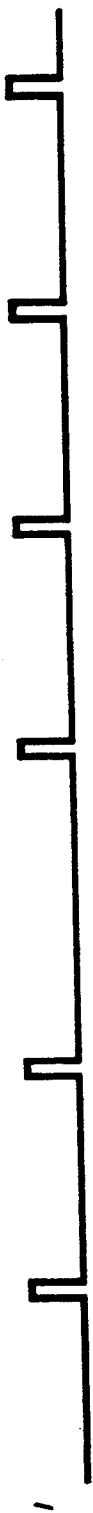
Fig.5F. Q̄'

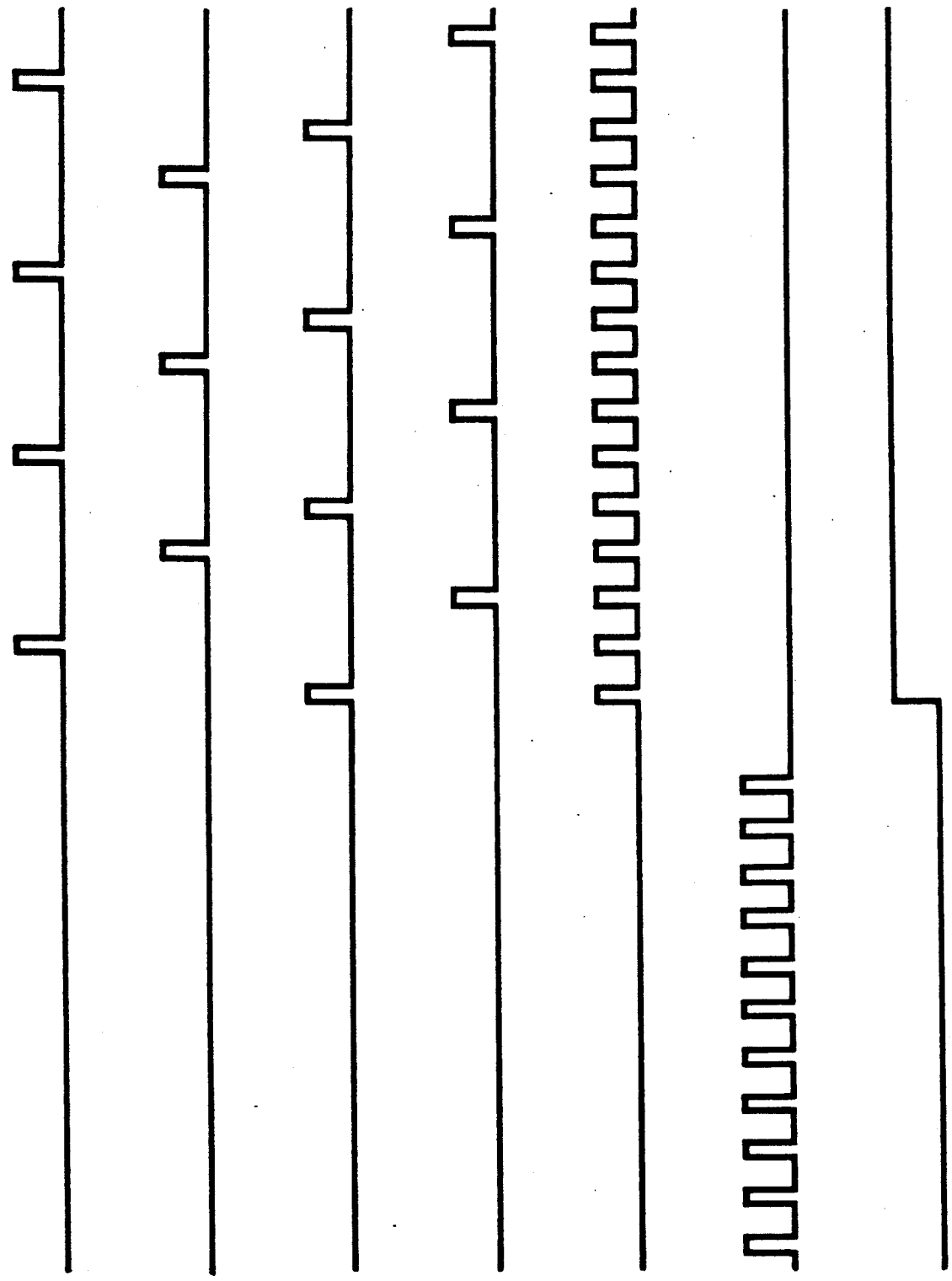

5,197,085

RADIO RECEIVER

BACKGROUND OF THE INVENTION

The present invention relates to radio receiver for FSK signals, such a receiver may be used as a paging receiver.

British Patent Specification 2,143,386A discloses a radio receiver suitable for use with FSK or angle modulated signals. The radio receiver comprises a frequency down-conversion stage which utilizes direct conversion techniques to provide zero IF quadrature baseband signals I and Q. The I and Q signals are limited in respective limiting amplifiers to form corresponding I and Q square wave signals. Pulse forming networks, for example differentiators, are coupled to the outputs of the respective limiting amplifiers to derive respective first and second pulse sequences, the outputs of which represent the polarity changes in the corresponding I and Q square wave signals. First and second multipliers are provided in which the I and Q square wave signals are multiplied by the second and first pulse sequences, respectively, to produce two pulse trains. Means are provided for combining the two pulse trains to give a digital output signal the frequency of which is equal to the sum of the frequencies of the two pulse trains. The digital output signal is applied to a low pass filter which produces a simulation of the original baseband modulation. More particularly the pulses in the digital output signal are smoothed to give approximately a dc level, the magnitude of which depends on the pulse frequency which in turn depends on the frequency of the beat note, that is the frequency difference between the receiver's local oscillator frequency and the frequency of the modulated signal.

The described receiver in principle functions satisfactorily if there is no drift between the local oscillator and modulated signal frequencies. However, in a practical situation drift will occur and the effect will be that the beat frequencies corresponding to binary "1" and "0" will be different. As a consequence of the low pass filtering the magnitude of the dc level will vary in accordance with the drift. In order to detect the value of the modulated signal a dynamic bit slicer is required. Dynamic bit slicers are complicated to design and consume a relative large current which undesirably increases the battery drain. The turn-on time of the receiver is lengthened by the use of the dynamic bit slicer which is a disadvantage when the receiver is operating in a battery economizing regime.

A reason for using a zero IF receiver is that it can be largely fabricated as an integrated circuit. However, as is well known, reactive components such as capacitors are expensive to integrate and if possible are avoided. Using a low pass filter to obtain an output dc signal mitigates against this as it requires one or more capacitors.

SUMMARY OF THE INVENTION

An object of the present invention is to overcome these disadvantages in the design of a radio receiver.

According to the present invention there is provided a receiver for FSK signals, characterized by means for receiving the FSK signals and producing quadrature related first and second frequency down-converted difference signals, means for amplitude limiting each of the first and second difference signals to form respectively first and second square wave signals, means for sampling the first and second square wave signals at changes in polarity of the second and first square wave signals, respectively, means for combining said samples and memory means responsive to a change in polarity in the combined signal for producing a first substantially constant dc output until the next following change in polarity is detected whereupon a second substantially constant dc output is produced.

By providing memory means responsive to a polarity change, which memory means may comprise a hysteresis circuit, the output signal voltage corresponds to the amplitude limited voltage indicative of a binary "1" or "0" and remains at that value until there is a polarity change. As a result the output signal voltage is, within the tolerances specified, independent of frequency drift. This means that a fixed level bit slicer can be used to detect the frequency modulation. A fixed level bit slicer is relatively simple to design and is economical in its current consumption. The memory means does not have either a frequency or impulse response and consequently does not require separate reactive components, such as capacitors, and is therefore cheaper to integrate.

In one embodiment of the present invention the means for sampling the first and second square wave signals comprises means for producing first and second pulse sequences corresponding respectively to successive changes in polarity of the first and second square wave signals, means for multiplying the first square wave signal by pulses in the second pulse sequence to produce a first product signal and means for multiplying the second square wave signal by pulses in the first pulse sequence to produce a second product signal, the first and second product signals being combined by the combining means.

In another embodiment of the present invention, means are provided for producing third and fourth square wave signals which are inverted versions of the first and second square wave signals, respectively, and the sampling means comprise logic gates operative on the first to fourth square wave signals to provide first and second sequences of pulses which are combined and applied to the memory means.

The sampling means may comprise first to eighth two-input AND gates, an input of each of the first and fourth AND gates being connected to receive the first square wave signal, an input of each of the fifth and eighth AND gates being connected to receive the second square wave signal, an input of each of the second and third AND gates being connected to receive the third square wave signal and an input of each of the sixth and seventh AND gates being connected to receive the fourth square wave signal; means for producing first to fourth sampling pulses corresponding to the occurrence of alternate edges having the same polarity change in the first to fourth square wave signals, respectively, the first sampling pulses being applied jointly to second inputs of the fifth and sixth AND gates, the second sampling pulses being applied jointly to second inputs of the third and fourth AND gates, the third sampling pulses being applied jointly to second inputs of the seventh and eighth AND gates and the fourth sampling pulses being applied jointly to second inputs of the first and second AND gates; and first and second four-input OR gates, the inputs of the first OR gate being coupled respectively to outputs of the first, third, fifth and seventh AND gates and the inputs of the second OR gate being coupled respectively to outputs of the second, fourth, sixth and eighth AND gates, outputs of the first and second OR gates being connected to the memory means.

BRIEF DESCRIPTION OF THE DRAWING

The present invention will now be described, by way of example, with reference to the accompanying drawing, wherein:

FIGS. 5A to 5M show waveforms applicable to the operation of the receiver shown in FIG. 4.

DETAILED DESCRIPTION OF THE PREFERRED EMBODIMENT

Figure 1:
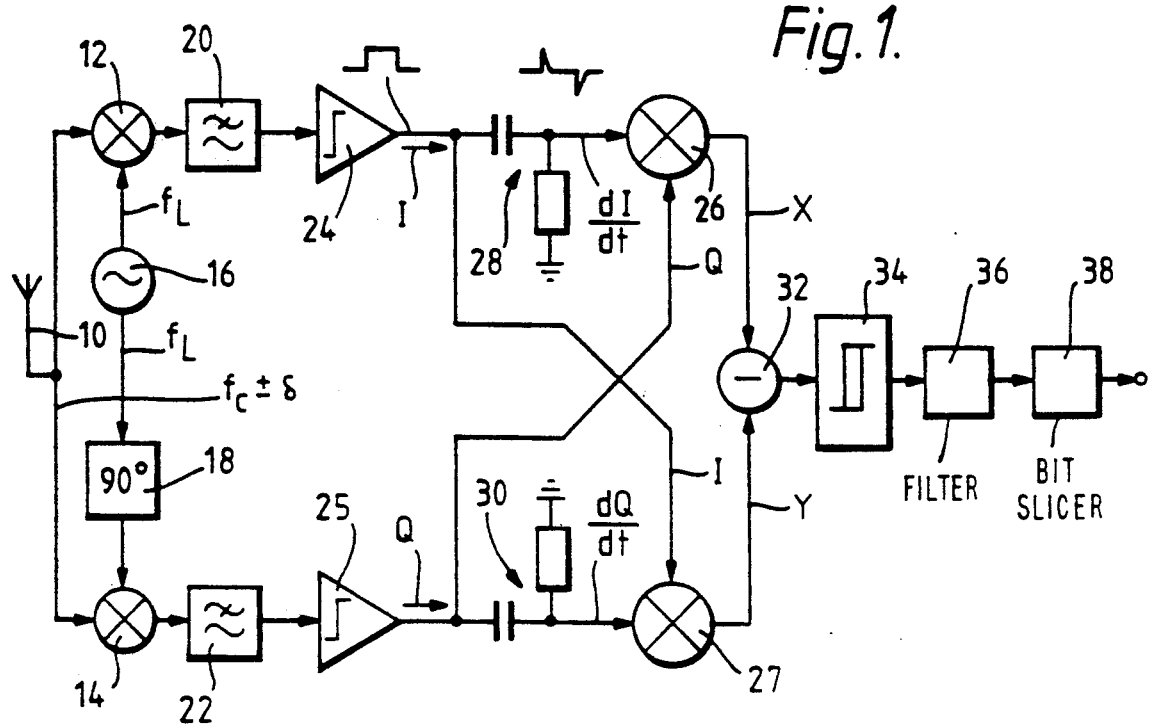
FIG. 1 is a block schematic diagram of an embodiment of a radio receiver made in accordance with the present invention.

In the drawing the same reference numerals have been used to identify corresponding features.

Referring to FIG. 1, the receiver comprises an antenna 10 for receiving FSK signals $f_c \pm \delta$, where $f_c$ is a nominal carrier frequency and $\delta$ is the offset frequency for example 4.5 kHz for a data signal of 512 bits/second. These signals are supplied to first inputs of first and second mixers 12,14. A local oscillator 16 generating a frequency $f_L$, where ideally $f_c = f_L$, is connected to second inputs of the first and second mixers 12, 14. In the case of the mixer 14, a 90 degree phase shifter 18 is connected into the signal path between the local oscillator 16 and the mixer 14. The difference outputs of the first and second mixers are $+\delta$ and $+\delta - \pi/2$ when the input signal is $f_c + \delta$, and $-\delta$ and $-\delta - \pi/2$ when the input is $f_c - \delta$.

In a non-illustrated arrangement of the receiver's front end, the phase shifter 18 is inserted into one of the signal paths between the antenna 10 and the first or second mixer 12 or 14, and the local oscillator 16 is connected directly to the second inputs of the mixers 12, 14.

The quadrature related difference signals are filtered in low pass filters 20, 22 and are then hard limited in respective limiting amplifiers 24, 25 which provide the I and Q square wave signals.

First and second signal multipliers 26, 27 are provided. The I and Q square wave signals are applied to the first inputs of the second and first multipliers 27, 26, respectively. These square wave I and Q signals are applied to respective pulse forming networks, for example C-R differentiators 28,30, which provide pulses corresponding to each edge of the respective square wave signal. The time constant of each pulse forming network is short compared to the bit rate, for example one hundredth of the period of the square wave signal. The pulse sequences corresponding to the I and Q square wave signals are applied to the multipliers 26,27, respectively. The outputs from the multipliers 26,27 are applied to a subtracting stage 32 which effectively forms the sum of the signals.

A bistable memory element 34, for example a hysteresis circuit, is connected to the output of the subtracting stage 32. The memory element 34 is followed by a glitch removing filter 36 and a fixed level bit slicer 38.

Figure 2A:
FIGS. 2A to 2H show waveforms applicable to the operation of the receiver shown in FIG. 1.
Figure 2B:
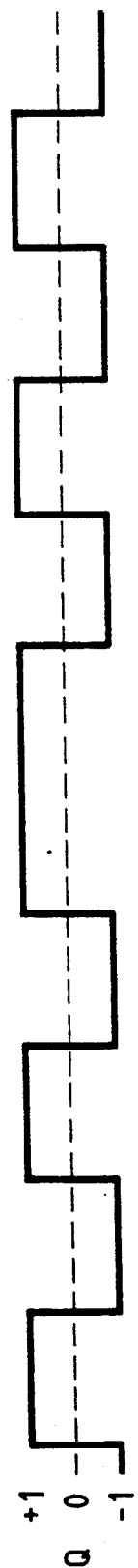
Figure 2C:
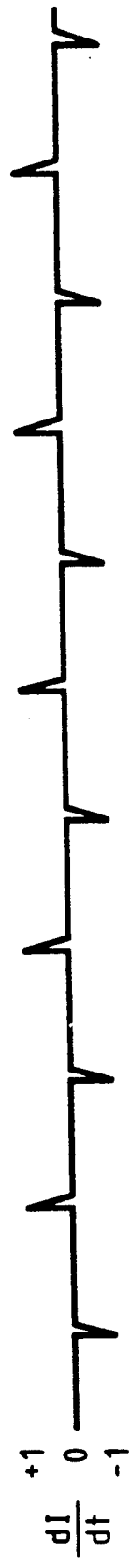
Figure 2D:
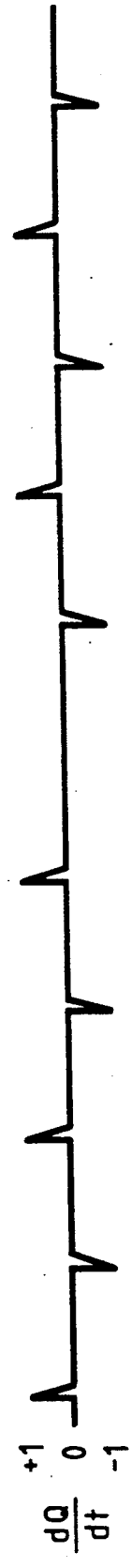
Figure 2E:
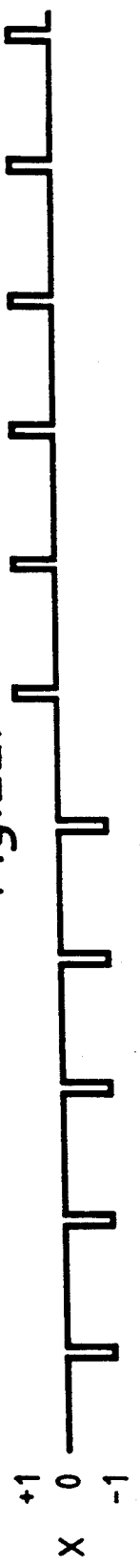
Figure 2F:
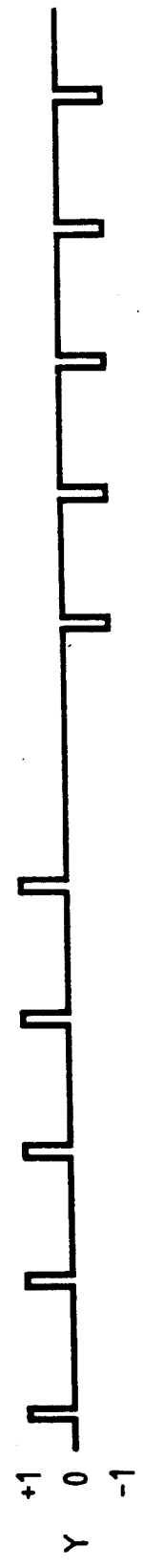
Figure 2G:
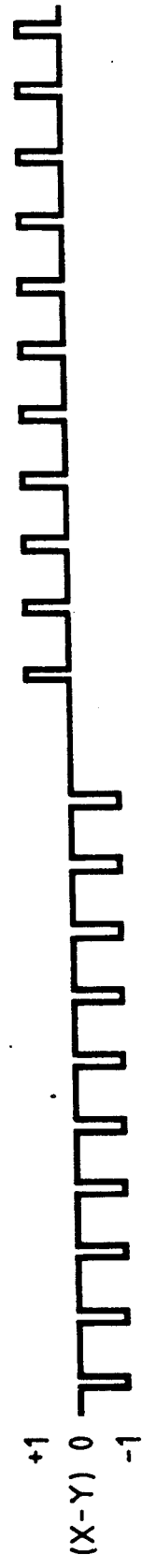
Figure 2H:
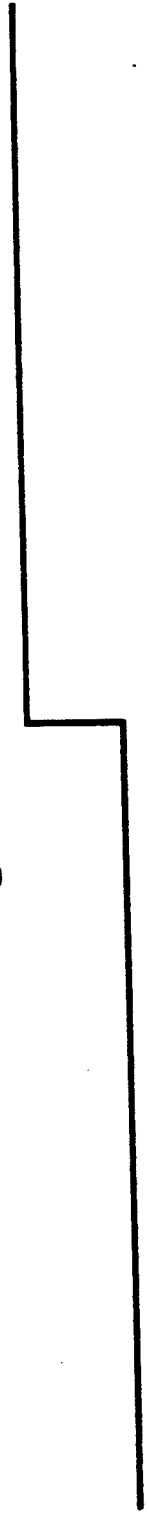

The operation of the receiver shown in FIG. 1 will now be described with reference to the waveforms shown in FIGS. 2A to 2H. FIGS. 2A and 2B respectively show the amplitude limited I and Q square wave signals, the amplitudes of which vary between $\pm 1$. The pulse sequences formed by the networks 28, 30 are shown in FIGS. 2C and 2D, respectively. FIGS. 2E and 2F show the outputs X,Y of the multipliers 26,27, respectively, and FIG. 2G illustrates the output of the subtracting stage 32. The output of the memory element 34 is shown in FIG. 2H and it will be noted that the polarity change from binary "0" to "1" occurs at the occurrence of the first positive pulse in the output from the subtracting stage 32. Since the memory element 34 changes state at the occurrence of the first pulse following any change of phase in the signal received at the antenna 10, it maintains a substantially constant dc output which is independent of the difference frequencies derived by the first and second mixers 12,14. Hence it is possible to determine the original data using the fixed level bit slicer 38. Further, the demodulator is inherently capable of demodulating signals at high data rates, up to the limit expected in an amplitude limited system, because it is responsive to a single edge change. As the system gives some inherent noise filtering, the filter 36 can, with advantage, be a digital filter, thus avoiding group delay problems which would occur with an analogue filter.

Figure 3:
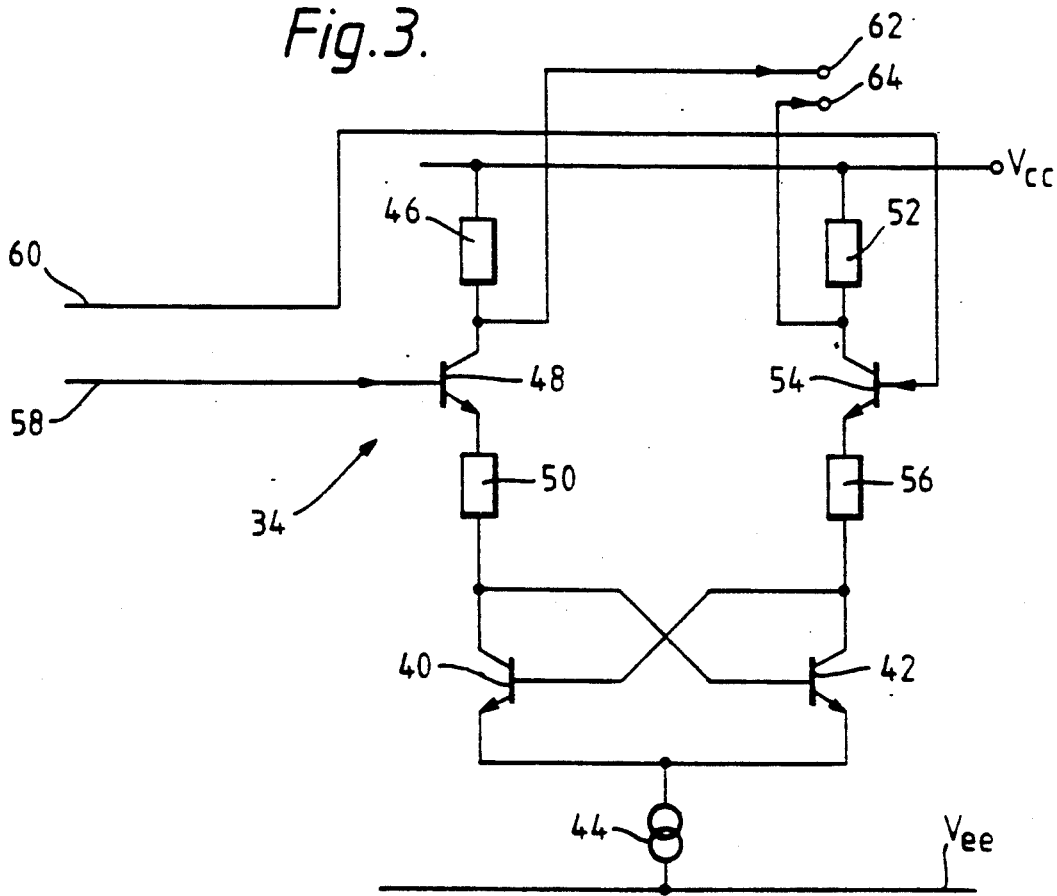
FIG. 3 is a circuit diagram of one embodiment of a hysteresis circuit.

FIG. 3 illustrates a hysteresis circuit which can be used as the memory element 34. The hysteresis circuit comprises a flip-flop circuit comprising NPN transistors 40,42 having their base and collector electrodes cross-coupled as is conventional and their emitter electrodes connected to a current source 44. The load circuit between the $V_{cc}$ line and the collector of the transistor 40 comprises the series connection of a first resistor 46, the collector-emitter path of a NPN transistor 48 and a second resistor 50. A similar series connection of a third resistor 52, the collector-emitter path of a NPN transistor 54 and a fourth resistor 56 between the $V_{cc}$ line and the collector of the transistor 42 constitutes the load circuit for the transistor 42. The signal output from the subtracting stage 32 (FIG. 1) is in reality a balanced output which in turn forms balanced inputs 58, 60 applied to the base electrodes of the transistors 48, 54, respectively. Balanced signal outputs 62,64 are derived from the collector circuits of the transistors 48,54, respectively.

In operation whenever the voltage difference applied to the transistors 48,54 exceeds a certain value, then the flip-flop circuit comprising transistors, 40,42 changes state and remains in that state until an opposite voltage difference occurs. It will be noted from the illustrated hysteresis circuit that the circuit comprises resistors and transistors and there are no intentional reactive components which means that it is economical to implement compared to the cost of a filter used in British Patent Specification 2143386A, discussed in the preamble. Additionally a hysteresis circuit also provides other advantages over using a filter, which advantages have already been referred to. demodulator. The demodulator assumes as its inputs amplitude demodulator. The demodulator assumes as its inputs amplitude limited square waves I, Ī, Q and Q̄. The circuit comprises four pairs of two input AND gates 66,67; 68,69; 70,71 and 72,73. The I signal is applied to AND gates 66,69, the Ī signal to gates 67,68, the Q signal to the gates 70,73 and the Q̄ signal to the gates 71,72.

Pulse sequences I', Ī', Q' and Q̄' are derived from the amplitude limited I and Q square wave signals using monostable circuits 74 to 77 and inverters 78,79 and are respectively applied to the AND gates 70,71; the gates 72,73; the gates 68,69 and the gates 66,67.

Two four-input OR gates 80,81 are provided. Inputs A to D of the OR gate 80 are connected respectively to the outputs of AND gates 66,68,70 and 72 and inputs A to D of the OR gate 81 are connected respectively to the outputs of AND gates 67,69,71 and 73. Outputs E,F of the OR gates 80,81, respectively, are connected to a set/reset flip-flop formed by two two-input NOR gates 82,83, an input to one being the output of the other, and vice versa. Balanced outputs Z, Z̄ are derived from the gates 82,83, respectively.

Figure 4:
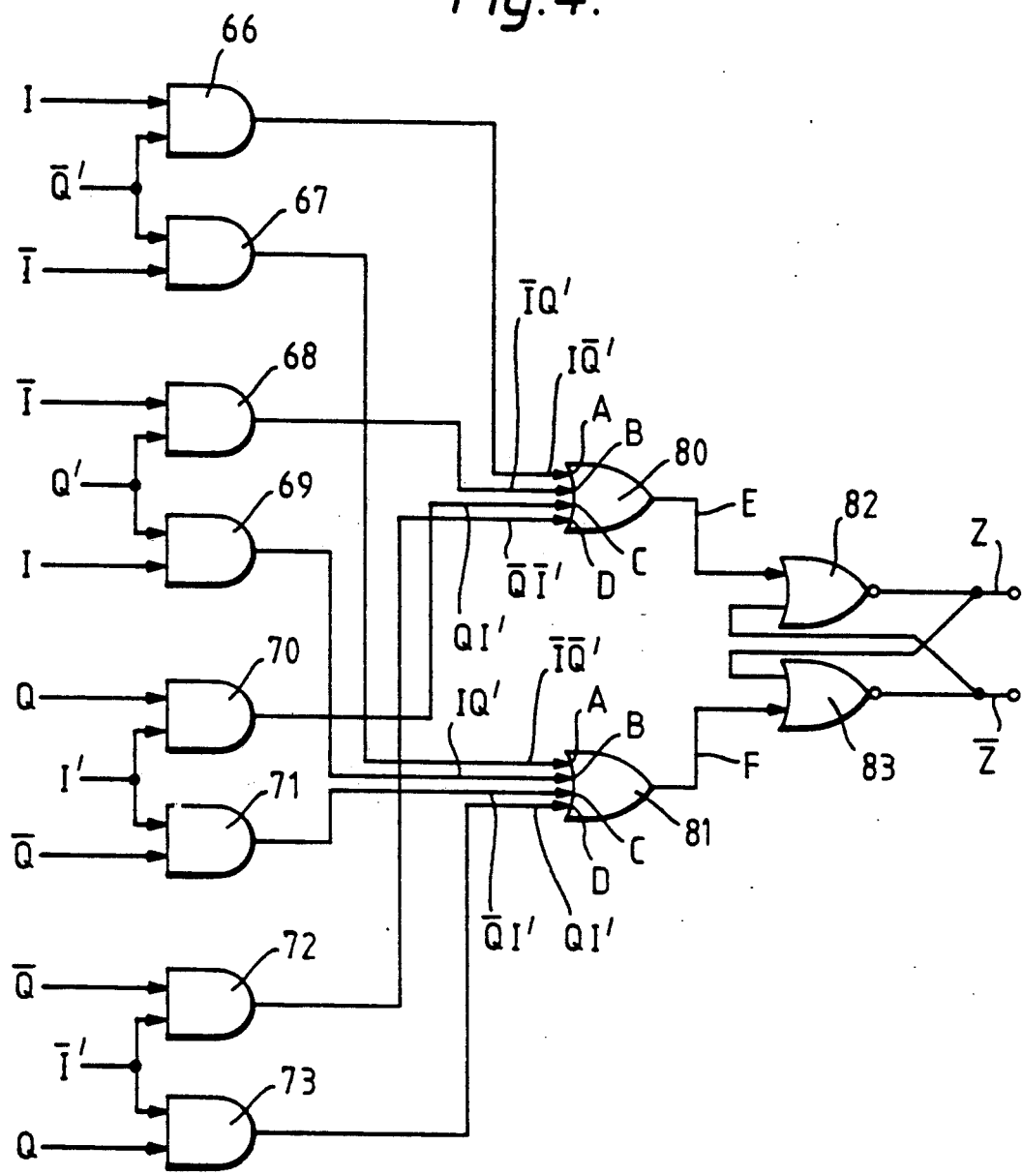
FIG. 4 is a circuit diagram of a digital embodiment of a demodulator suitable for use in the receiver in accordance with the present invention.
Figure 4:
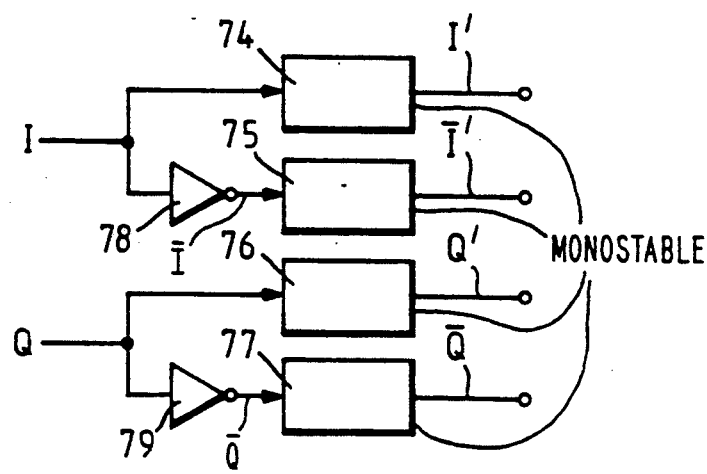

The operation of the circuit shown in FIG. 4 will now be described with reference to the waveforms shown in FIGS. 5A to 5M. FIGS. 5A and 5B show the I and Q amplitude limited square waves, respectively, the other square wave inputs Ī and Q̄ the antiphase versions of the I and Q signals, respectively. FIGS. 5C to 5F are the pulse sequences occurring at the outputs of the monostable circuits 74 to 77, respectively. It will be noted that the pulses in each sequence corresponding to the positive going edge in the respective square wave signal and that the duration of each pulse is small compared to that of the associated square wave. In the pairs of AND gates the input square wave signals are sampled at a point in time phase shifted from their edges by substantially 90 degrees. FIGS. 5G to 5J show the inputs A to D of the OR gate 80 which inputs have been referenced $A_{80}$, $B_{80}$, $C_{80}$ and $D_{80}$. The inputs A to D of the OR gate 82 are not shown but can be deduced by examination of FIGS. 5A to 5F.

FIGS. 5K and 5L illustrate the outputs E,F of the OR gates 80,81, respectively, which outputs are applied to the set/reset flip/flop, the output Z of which is shown in FIG. 5M. The operation of the embodiment shown in FIG. 4 is generally equivalent to that of the analogue embodiment shown in FIG. 1 in that the edge detection using the AND gates 66 to 73 is equivalent to pulse forming networks 28,30 (FIG. 1), the OR gates 80,81 are generally equivalent to the first and second multipliers 24,26 (FIG. 1) and the inversion of signals to, and the operation of, the set/reset flip-flop is generally equivalent to the subtracting stage 32 and the bistable memory element 34 (FIG. 1).

From reading the present disclosure, other modifications will be apparent to persons skilled in the art. Such modifications may involve other features which are already known in the design, manufacture and use of zero IF and/or FSK receivers and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalization thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A receiver for FSK signals, comprising:
means for receiving the FSK signals and producing quadrature related first and second frequency down-converted difference signals,
means for amplitude limiting each of the first and second difference signals to form respective first and second square wave signals,
means for producing first and second pulse sequences corresponding respectively to successive changes in polarity of the first and second square wave signals, respectively,
means for combining said pulse sequences to form a combined signal, and
means for simulating an analog output representative of the FSK signal,
characterized in that said means for combining comprises:
means for multiplying the first square wave signal by pulses in the second pulse sequence to produce a first product signal,
means for multiplying the second square wave signal by pulses in the first pulse sequence to produce a second product signal, and
means for combining said first and second product signals; and
said means for simulating comprises memory means responsive to a change in polarity in the combined signal for producing a first substantially constant dc output until the next following change in polarity is detected, and responsive to detection of said next following change in polarity, producing a second substantially constant dc output.

2. A receiver as claimed in claim 1 wherein the memory means comprises a hysteresis circuit.

3. A receiver as claimed in claim 1 further comprising a fixed level bit slicer is coupled to the output of the memory means.

4. A receiver as claimed in claim 3, further comprising a digital glitch removing filter coupled between the output of the memory means and the fixed level bit slicer.

5. A receiver for FSK signals, comprising:
means for receiving the FSK signals and producing quadrature related first and second frequency down-converted difference signals,
means for amplitude limiting each of the first and second difference signals to form respective first and second square wave signals,
means for producing third and fourth square wave signals which are inverted versions of the first and second square wave signals, respectively,
sampling means comprising logic gates operative on said first to fourth square wave signals to provide a pair of sequences of pulses,
means for combining said pair of sequences to produce a combined signal, and
means for simulating an analog output representative of the FSK signal,
characterized in that said means for simulating comprises memory means responsive to a change in polarity in the combined signal for producing a first substantially constant dc output until the next following change in polarity is detected, and responsive to detection of said next following change in polarity, producing a second substantially constant dc output, and said sampling means comprises means for producing pulse sequences having polarity indicative of changes in respective said square wave signals, a plurality of AND gates connected to receive respective combinations of said pulse sequences and said square wave signals, and a plurality of OR gates connected to receive respective combinations of outputs of said AND gates, outputs of said OR gates being connected to said memory means.

6. A receiver for FSK signals, comprising:

means for receiving the FSK signals and producing quadrature related first and second frequency down-converted difference signals, means for amplitude limiting each of the first and second difference signals to form respective first and second square wave signals, means for producing third and fourth square wave signals which are inverted versions of the first and second square wave signals, respectively, sampling means comprising logic gates operative on said first to fourth square wave signals to provide a pair of sequences of pulses, means for combining said pair of sequences to produce a combined signal, and means for simulating an analog output representative of the FSK signal, characterized in that said means for simulating comprises memory means responsive to a change in polarity in the combined signal for producing a first substantially constant dc output until the next following change in polarity is detected, and responsive to detection of said next following change in polarity, producing a second substantially constant dc output, and said logic gates comprise first to eighth two-input AND gates, an input of each of the first and fourth AND gates being connected to receive the first square wave signal, an input of each of the fifth and eighth AND gates being connected to receive the second square wave signal, an input of each of the second and third AND gates being connected to receive the third square wave signal, and an input of each of the sixth and seventh AND gates being connected to receive the fourth square wave signal;

means for producing first to fourth sampling pulses corresponding to the occurrence of alternate edges having the same polarity change in the first to fourth square wave signals, respectively, the first sampling pulses being applied jointly to second inputs of the fifth and sixth AND gates, the second sampling pulses being applied jointly to second inputs of the third and fourth AND gates, the third sampling pulses being applied jointly to second inputs of the seventh and eighth AND gates and the fourth sampling pulses being applied jointly to second inputs of the first and second AND gates; and first and second four-input OR gates, the inputs of the first OR gate being coupled respectively to outputs of the first, third, fifth and seventh AND gates, and the inputs of the second OR gate being coupled respectively to outputs of the second, fourth, sixth and eighth AND gates, outputs of the first and second OR gates being connected to the memory means.

7. A receiver as claimed in claim 6, characterized in that the memory means comprises a hysteresis circuit.

8. A receiver as claimed in claim 6, comprising a fixed level bit slicer coupled to the output of the memory means.

9. A receiver as claimed in claim 8, further comprising a digital glitch removing filter coupled between the output of the memory means and the fixed level bit slicer. e

* * * * *